United States Patent [19]
Jiang et al.

[11] Patent Number: 6,113,709
[45] Date of Patent: Sep. 5, 2000

[54] METHOD OF PREPARING A CONDUCTIVE BONDING PAD

[75] Inventors: Tongbi Jiang, Boise; Li Li, Meridian, both of Id.

[73] Assignee: Micron Technology, Inc., Boise, Id.

[21] Appl. No.: 09/060,786

[22] Filed: Apr. 15, 1998

[51] Int. Cl.$^7$ .................................................. C23C 22/00
[52] U.S. Cl. .......................... 148/240; 148/251; 148/275; 148/272; 148/274; 148/276; 148/285
[58] Field of Search ..................................... 148/240, 243, 148/248, 251, 253, 264, 272, 274, 275, 276, 283, 285

[56] References Cited

PUBLICATIONS

Kuechenmeister, et al., "Polypyrrole as an Interlayer for Bonding Conductive Adhesives to Activated Aluminum Bond Pads," IEEE Transactions on Components, Packaging and Manufacturing Technology, Part A, vol. 20, No. , pp. 9–14, (Mar. 1997).
Vork, et al., "Structural Effects in Polypyrrole Synthesis," Electrochimica Acta, vol. 33, No. 11, pp. 1513–1517 (1988).
Beck, "Review Article: Electrodeposition of Polymer Coatings," Electrochimica Acta, vol. 33, No. 11, pp. 839–850 (1988).
Asavapiriyanont, et al., "The Electrodeposition of Polypyrrole Films From Aqueous Solutions," J. Electroanal. Chem. 177 pp. 229–244 (1984).

*Primary Examiner*—John Sheehan
*Assistant Examiner*—Andrew L. Oltmans
*Attorney, Agent, or Firm*—Workman, Nydegger & Seeley

[57] ABSTRACT

The present invention is drawn to a method of lowering the net resistivity of an interconnect by depositing a monomer layer upon an aluminum bonding pad, the treatment thereof to cross link the monomer to form an electrically conductive polymer, and simultaneously, the substantial reduction of alumina, $Al_2O_3$, to metallic aluminum. In the method of the present invention, deposition of a monomer layer in a solvent, volatilization of the solvent, and contact with a strong oxidizer such as a potassium permanganate allows for the use of the strong oxidizer without the hindrance of having to deal with a manganese oxide husk on the surface of the aluminum bonding pad. Preferably, the chemical qualities of the monomer will include the tendency to be a reducing agent to the native oxide film of the bonding pad. By selecting a monomer that tends to reduce rather than to oxidize, the problem of thickening the native oxide film is avoided. Another preferred chemical quality of the monomer and its polymer after cross linking, is that it will act as a protective coating to the chip package for substantially all further processing. In particular, the monomer or its cross-linked polymer will act as a protective coating to the chip package during an acid dip in an oxidizer solution such as acidic $KMnO_4$.

48 Claims, 2 Drawing Sheets

METHOD OF PREPARING A CONDUCTIVE BONDING PAD

BACKGROUND OF THE INVENTION

1. The Field of the Invention

The present invention relates to electrical connections in semiconductor chip technology. More particularly, the present invention relates to formation of substantially dielectric-free bonding pads for semiconductor chips. In particular, the present invention relates to a method of removal of oxide from a metallic bonding pad through the use of an oxidizing compound that catalyzes the reductive polymerization of an electrically-conductive monomer.

2. The Relevant Technology

In the microelectronics industry, a substrate refers to one or more semiconductor layers or structures which includes active or operable portions of semiconductor devices. In the context of this document, the term "semiconductive substrate" is defined to mean any construction comprising semiconductive material, including but not limited to bulk semiconductive material such as a semiconductive wafer, either alone or in assemblies comprising other materials thereon, and semiconductive material layers, either alone or in assemblies comprising other materials. The term substrate refers to any supporting structure including but not limited to the semiconductive substrates described above. The term semiconductor substrate is contemplated to include such structures as silicon-on-insulator and silicon-on-sapphire.

Electrical interconnections, such as for flip chip or printed circuit board interconnections that are to connect a semiconductor die pad circuit to a supporting substrate, have historically been made with plating methods and reflow solder attachment methods. Electrically conductive epoxy has also been used to make the electrical interconnections. The use of electrically conductive epoxy interconnections typically have problems with high contact resistance. For example, when used to contact an aluminum bonding pad, which is a semiconductor industry standard, a nonconductive oxide-coated surface forms on the aluminum bonding pad under ambient conditions. Because of the nonconductive oxide, electrically conductive epoxies on otherwise bare aluminum form an interconnect having an unacceptably high electrical resistance at the contact. The contact electrical resistance may be in a range from about 100 ohms to several millions of ohms.

Efforts to reduce contact electrical resistance include using a precious metal such as gold. Gold, however, due to its cost makes mass production of gold bonding pads uneconomical. Additionally, the plating of gold as a semiconductor chip or printed circuit board bonding pad is a difficult process that in and of itself is expensive and time consuming. For example, electroless plating processes are difficult to achieve. Hence, the semiconductor substrate or printed circuit board must be electrically connected to a power supply in order to achieve gold plating.

Other methods to reduce the contact electrical resistance caused by the oxide formed upon the bonding pad include chemical and/or mechanical removal, typically by abrasive means. Although removal of oxides is achievable, the contact will immediately re-oxidize to form a native oxide film unless the contact is in a protected environment.

Another method that has been employed to resist oxidation of metal bonding pads, for example bonding pads made of aluminum, includes the deposition of a strong oxidizer directly upon the bonding pad. When a strong oxidizer is placed directly upon the bonding pad, it forms an oxide husk upon the bonding pad. The oxide husk must be subsequently consumed completely because it otherwise acts as an electrical insulator. Where a stoichiometric excess is needed to get a reaction to provide a sufficient product, formation of excess oxide husk causes additional challenges for its ultimate removal. Removal of any native oxide from the bonding pad will be undermined by the residual presence of the oxide husk formed from the strong oxidizer due to its function as an electrical resistor.

In one prior art attempt to solve the problem of removing the native oxide film, a strong oxidizer is contacted to the bonding pad and an oxide husk thereof deposits upon the native oxide film. FIG. 1 illustrates a cross-sectional view of a portion of a bonding pad structure 10 that includes an aluminum bonding pad 12 with a native oxide film 14 upon a free surface 16. A manganese oxide husk 18 is next formed upon native oxide film 14 by contact with a strong oxidizer such as potassium permanganate. Next, an electrically conductive polymer 20 is formed upon the manganese oxide husk. This method presents several problems. First, the proper amount of the strong oxidizer making contact with the native oxide film 14 is critical. Formation of an excessive amount of manganese oxide husk 18 upon native oxide film 14 will make its removal difficult during formation of electrically conductive polymer 20. Thus, a dielectric interlayer between aluminum bonding pad 12 and any external wiring such as a conductive bump for flip chips or a soldering wire will substantially hinder electrical conductivity. Second, due to the nature of the strong oxidizer, additional oxidation of aluminum bonding pas 12 may occur to thicken native oxide film 14. Third, if an insufficient amount of electrically conductive polymer 20 is formed above manganese oxide husk 18, an insufficient quantity of the metal oxide will be reduced, including any of the native oxide film of the bonding pad. Finally, forming too much of electrically conductive polymer 20 upon manganese oxide husk 18 will prevent complete formation of the polymer such that electrical conductivity through an uncompleted polymer layer will be substantially reduced.

What is needed in the art is a method of forming a substantially oxide-free bonding pad without the problems of the prior art. What also is needed is a method of forming a substantially oxide-free bonding pad that contains no residual substance that was used to remove native oxide and that contains no such substance that might simultaneously interfere with the electrical conductivity of the bonding pad.

SUMMARY OF THE INVENTION

The present invention is drawn to a method of lowering the net resistivity of an interconnect by depositing a monomer layer upon a metal bonding pad, the treatment thereof to cross-link the monomer to form an electrically conductive polymer, and simultaneously, the substantial reduction of metal oxide to zero valent metal.

In the method of the present invention, deposition of a monomer layer in a solvent, volatilization of the solvent, and contact with a strong oxidizer such as a potassium permanganate allows for the use of the strong oxidizer without the hindrance of having to deal with a manganese oxide husk on the surface of the aluminum bonding pad.

The present invention includes cleaning at least one bonding pad of a chip package or printed circuit board by any appropriate chemical rinse so as to remove harmful particulates and other pollutants whether organic or inorganic. Following cleaning of the bonding pad, a monomer is selected and contacted with the bonding pad. The monomer may be solubilized with any preferred type of solvent such as water or an organic solvent. Care should be taken not to prematurely cause cross-linking of the monomer during the process of volatilizing at least some of the solvent.

Preferably, the chemical qualities of the monomer will include the tendency to be a reducing agent to the native oxide film of the bonding pad. By selecting a monomer that tends to reduce rather than to oxidize, the problem of thickening the native oxide film is avoided. Another preferred chemical quality of the monomer and its polymer after cross-linking, is that it will act as a protective coating to the chip package for substantially all further processing. In particular, the monomer or its cross-linked polymer will act as a protective coating to the chip package during an acid dip in an oxidizer solution such as acidic $KMnO_4$.

Following the formation of the monomer into a monomer layer, a strong oxidizer film is deposited upon the monomer layer. With a film of a strong oxidizer in place upon the monomer layer, conditions are selected to cause the strong oxidizer to cross-link the monomer layer. In the present invention, the method of cross-linking the monomer layer may be done for example by dipping the assembly of bonding pad, native oxide film, monomer layer, and strong oxidizer film in an acid solution.

Alternatively, the strong oxidizer may first contact the monomer layer as oxidizer dissolved in an acidic solution by dipping the bonding pas or by spraying the acidic oxidizer solution. Under such conditions, the strong oxidizer is dissolved in an aqueous acidic solution and the bonding pad is immersed into the solution or the solution is sprayed thereupon. Under most conditions, stirring of the solution is not carried out and dipping is preferred. By not stirring, only a film of strong oxidizer immediately adjacent to the monomer layer is substantially active upon the monomer layer.

Upon contact with an acid environment, the strong oxidizer begins to cross link the monomer layer making the cross linking monomer layer more electrically conductive. Simultaneously, with the cross linking of the monomer layer, because of its tendency to be a reducing agent, or at least significantly less prone to oxidize the bonding pad than the strong oxidizer, the native oxide film is reduced to zero valent metal and the bonding pad is simultaneously covered by the cross-linked polymer.

Below an electrode potential difference of about 1 V between the strong oxidizer and the monomer layer, oxidation of the monomer layer and the subsequent reduction of the native oxide film upon the bonding pad may be assisted by controlling concentration of the strong oxidizer and/or the monomer cross linking reaction temperature. Thus, where a lower electrode potential difference is required, a higher oxidizer concentration, a more acidic solution, an increase in the reaction temperature, or a subset thereof will assist in appropriate and substantially complete cross linking of the monomer layer. The oxidation of the monomer layer through cross linking will both cause its polymer to be more electrically conductive, and will eliminate the native oxide film from the metallic surface of the bonding pad. Thereby, the net electrical resistivity of the interconnect will be lowered.

Following cross linking of the monomer layer and reduction of the native oxide film according to method of the present invention, the surface of the chip package is cleaned according to know methods in the art.

Distinct advantages are exhibited by the method of the present invention. In the method of the present invention, a stoichiometric excess of strong oxidizer provides no hindrance to achieving a final article of bonding pad that is substantially free of oxides.

Where conditions of cross linking the monomer layer are carried out by dipping the bonding pad into a solution of acidic oxidizer, the degree of stoichiometric excess is of substantially no concern. The technique of providing a stoichiometric excess of the oxidizer in the prior art caused the problem of having excess of metal oxide husk remain directly upon the bonding pad that resulted in increased resistivity. In the present invention, where a dip is carried out, a process engineer may use substantially any stoichiometric excess of strong oxidizer that is desired in order to properly cross link the monomer layer. Thereby, where the bonding pad is aluminum or an alloy thereof, it is assured that the monomer layer during cross linking will substantially reduce all alumina to metallic aluminum.

These and other features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Reference will now be made to the drawings wherein like structures will be provided with like reference destinations. It is to be understood that the drawings are diagrammatic and schematic representations of the embodiment of the present invention and are not drawn to scale.

Figure 1:
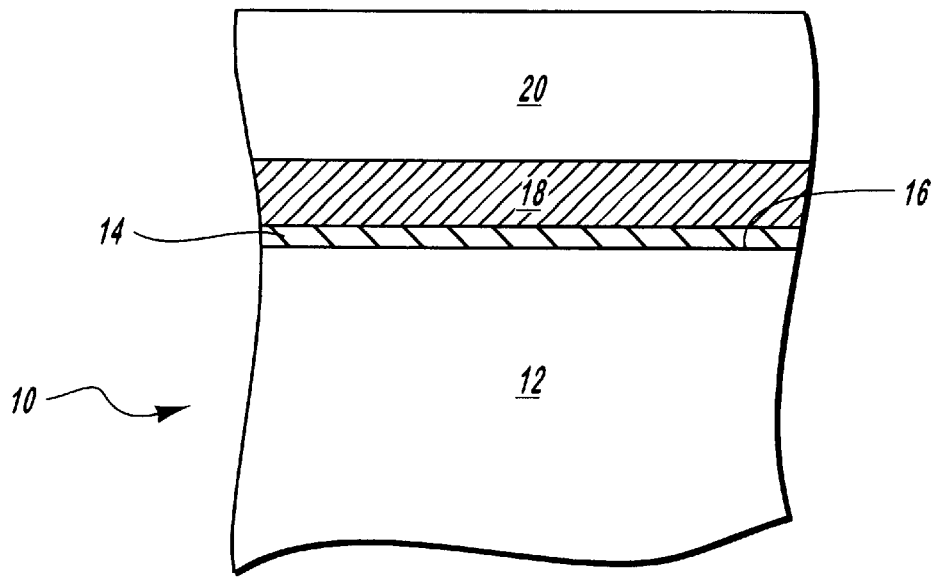
FIG. 1 is an elevational cross-section view of a portion of an aluminum bonding pad according to a method known in the prior art, wherein a native oxide film is surmounted with an manganese oxide husk and a polymer film is formed upon the manganese oxide husk.

The present invention is drawn to a method of lowering the net resistivity of an interconnect by depositing a monomer layer upon a bonding pad, the treatment thereof to cross link the monomer to form an electrically conductive polymer, and simultaneously, the substantial reduction of metal oxide on the bonding pad to zero valent metal. The present invention overcomes problems that were caused, as seen in FIG. 1, from formation of manganese oxide husk 18 directly upon the aluminum of bonding pad 12.

In the method of the present invention, deposition of a monomer layer in a solvent, volatilization of the solvent, and contact with a strong oxidizer such as a potassium permanganate allows for the use of the strong oxidizer without the hindrance of having to deal with a manganese oxide husk on the surface of the aluminum bonding pad.

The present invention includes cleaning at least one bonding pad of a chip package or printed circuit board (PCB) by any appropriate chemical rise so as to remove harmful particulates and other pollutants whether organic or inorganic. Following the cleaning of the bonding pad, a monomer is selected and contacted with the bonding pad. The monomer may be solubilized with any preferred type of solvent such as water or an organic solvent. Care should be taken not to prematurely cause cross linking of the monomer during the process of volatilizing at least some of the solvent.

Preferably, the chemical qualities of the monomer will include the tendency to be a reducing agent to the native oxide film of the bonding pad. By selecting a monomer that tends to reduce rather than to oxidize, the problem of thickening the native oxide film is avoided. Another preferred chemical quality of the monomer, and its polymer after cross linking, is that it will act as a protective coating to the chip package for substantially all further processing. In particular, the monomer or its cross-linked polymer will act as a protective coating to the chip package during an acid dip in an oxidizer solution such as acidic $KMnO_4$.

Following formation of the monomer into a monomer layer, a strong oxidizer film is deposited upon the monomer layer. By way of non-limiting example, $KMnO_4$ in a concentration from about 0.1 M to about 2 M is formed upon the preferred monomer layer. Where $KMnO_4$ is required in a lower concentration range, a concentration from about 0.1 M to about 1.2 M is preferred, more preferably from about 0.6 M to about 1.1 M, and most preferably about 1 M. Where $KMnO_4$ is required in higher concentrations, a concentration range from about 0.8 M to about 2 M is preferred, more preferably from about 1.2 M to about 1.8 M, and most preferably 1.6 M.

With a film of a strong oxidizer in place upon the monomer layer, conditions are selected to cause the strong oxidizer to cross link the monomer layer. In the present invention, the method of cross linking the monomer layer may be done for example by dipping the assembly of bonding pad, native oxide film, monomer layer, and strong oxidizer film in an acid solution.

Alternatively, the strong oxidizer may first contact the monomer layer as dissolved oxidizer in an acidic solution by dipping the bonding pad or by spraying the acidic oxidizer solution. Under such conditions, the strong oxidizer is dissolved in an aqueous acidic solution and the bonding pad is immersed into the solution or the solution is sprayed thereupon. Under most conditions, stirring of the solution is not carried out and dipping is preferred. By not stirring, only a film of strong oxidizer immediately adjacent to the monomer layer is substantially active upon the monomer layer.

Upon contact with an acid environment, the strong oxidizer begins to cross link the monomer layer making the cross linking monomer layer more electrically conductive. Simultaneously, cross linking of the monomer layer because of its tendency to be a reducing agent, or at least significantly less prone to oxidize the bonding pad than the strong oxidizer, the native oxide film is reduced to zero valent metal and is simultaneously covered by the cross-linked polymer.

Where the bonding pad is, by way of non-limiting example aluminum, preferred for the electrode potential of the monomer is that it have an electrode potential that is less negative than the standard reduction potential of trivalent aluminum. More preferably, the electrode potential of the monomer will be in an electrode potential voltage difference from that of the strong oxidizer in a range from about 0.5 V to about 2.5 V. That is, by way of non-limiting example, the difference between the electrode potential of the permanganate species with the cation in the +7 oxidation state and the electrode potential of the pyrrole monomer is about 2 V. Additionally, the difference between the electrode potential of the cation in the strong oxidizer and the monomer may be selected to have a difference of about 1.2 V.

Where a specific application requires a smaller difference in electrode potential between the strong oxidizer and the monomer, an electrode potential difference of about 1.0 V may be selected. Where closer electrode potential differences are more important to the process, the electrode potential difference for this non-limiting example may be from about 0.6 V versus SCE to about 0.9 V versus SCE. In this region, the pyrrole monomer experiences the onset of oxidation and cross linking and approaches the endpoint of oxidation and crosslinking.

Below an electrode potential difference of about 1 V between the strong oxidizer and the monomer layer, oxidation of the monomer layer and the subsequent reduction of the native oxide film upon the bonding pad may be assisted by controlling concentration of the strong oxidizer and/or the monomer cross linking reaction temperature. Thus, where a lower electrode potential difference is required, a higher oxidizer concentration, a more acidic solution, an increase in the reaction temperature, or a subset thereof will assist is appropriate and substantially complete cross linking of the monomer layer. The oxidation of the monomer layer through cross linking will both cause its polymer to be more electrically conductive, and will eliminate the native oxide film from the metallic surface of the bonding pad. Thereby, the net electrical resistivity of the interconnect will be lowered.

Following cross linking of the monomer layer and reduction of the native oxide film according to the method of the present invention, the surface of the chip package is cleaned according to known methods in the art.

Distinct advantages are exhibited by the method of the present invention. In the method of the present invention, a stoichiometric excess of strong oxidizer provides no hindrance to achieving a final article of an aluminum bonding pad that is substantially free of oxides. A preferred stoichiometric excess of strong oxidizer to monomer is in a range from about 1.0 to about 3, more preferably from about 1.05 to about 2, and most preferably in a range from about 1.1 to about 1.5.

Where conditions of cross linking the monomer layer are carried out by dipping the bonding pad into a solution of acidic oxidizer, the degree of stoichiometric excess is substantially of no concern. The technique of providing a stoichiometric excess of the oxidizer in the prior art caused the problem of having an excess of metal oxide husk that remained directly upon the aluminum bonding pad which resulted in increased resistivity. In the present invention, where a dip is carried out, a process engineer may use substantially any stoichiometric excess of strong oxidizer that is desired in order to properly cross link the monomer layer. Thereby, where the bonding pad is aluminum or an alloy thereof, it is assured that the monomer layer during cross linking will substantially reduce all alumina to metallic aluminum.

Figure 2:
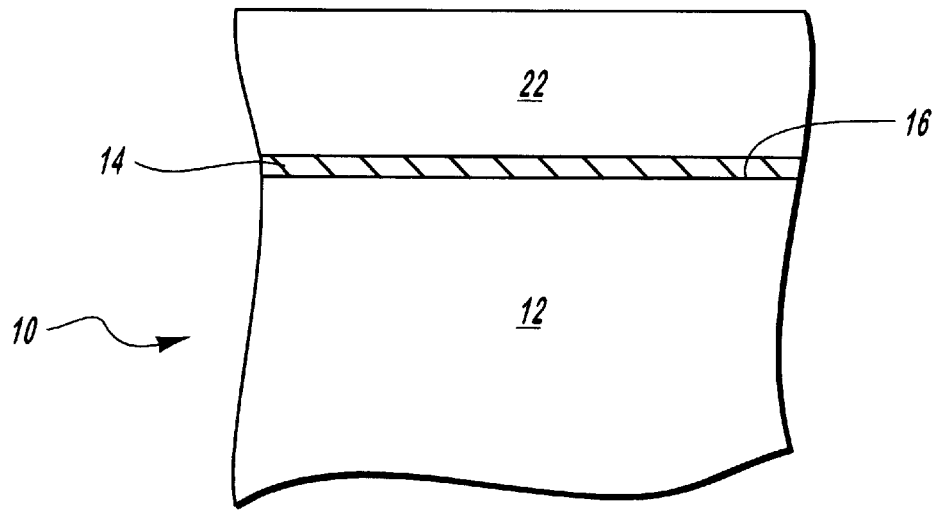
FIG. 2 is an elevational cross-section view of an aluminum bonding pad being processed according to the method of the present invention, wherein a monomer layer is formed upon a native oxide film of the aluminum bonding pad.

A general example of the present invention is set forth below. As illustrated in FIG. 2, a chip package or a printed circuit board having at least one aluminum bonding pad structure 10 is cleaned according to the particular application being used. A monomer layer 22 that will form an electrically conductive polymer upon cross linking is selected from the group consisting of p-phenylene, aniline, and the like. Alternatively, monomer layer 22 is formed from acetylene and the like. Alternatively, monomer layer is formed from pyrrole, thiophene and the like. Upon cross linking of monomer layer 22, a polymer will be formed from the aforementioned groups of their equivalents. Where a preferred electrode potential difference between a selected strong oxidizer and a selected monomer is not substantially within the range that is desirable, selection of mixtures of monomers may be provided to achieve a desired electrode potential difference therebetween. Alternatively, a single monomer may be chosen and a mixture of strong oxidizers may be selected so as to achieve a net electrode potential difference that is desired for a particular application. Also, combinations of at least two monomers may be chosen in combination with at least two strong oxidizers to achieve a preferred net electrode potential difference. Finally, conditions may be manipulated by altering strong oxidizer concentrations, acid concentrations, process temperatures, and combinations thereof.

In a preferred embodiment, pyrrole is selected in a carrier such as water, acetonitrile, an alcohol, tetrahydrofuran, and the like. Preferably, the solvent is substantially electrochemically inactive during the cross linking of monomer layer 22. Alternatively, the monomer solvent is substantially removed by drying or evaporation techniques.

Figure 3:
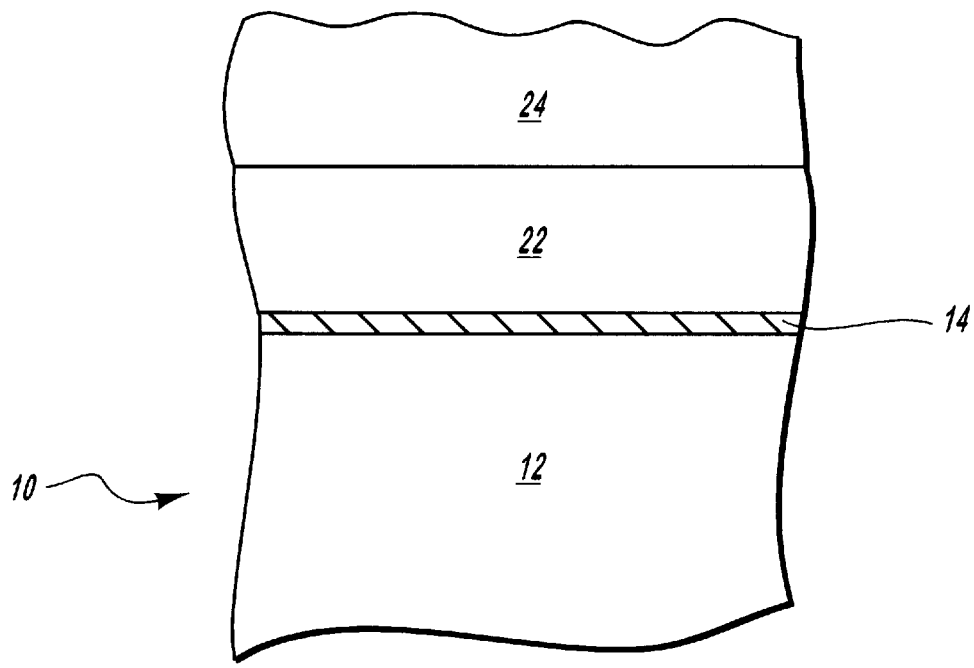
FIG. 3 is an elevational cross-section view of the bonding pad structure depicted in FIG. 2 after further processing, wherein a strong oxidizer film is formed upon the monomer layer and wherein oxidation and cross linking of the monomer layer and reduction of the native oxide film is commenced.

Following the formation of monomer layer 22 upon native oxide film 14 of aluminum bonding pad 12, strong oxidizer film 24 is contacted with monomer layer 22 as seen in FIG. 3. Preferred strong oxidizers include $KMnO_4$, $NaClO_4$, $K_2Cr_2O_7$, and the like. In the selection of a preferred strong oxidizer, care must be given to choose oxidizer salts that will not substantially pollute into the chip package or PCB during aqueous dissociation of the metal cation from the strong oxidizing anion.

In the present invention, according to the example, formation of strong oxidizer film 24 upon monomer layer 22 can be done by applying strong oxidizer film 24 and allowing it to dry or by dipping the chip package into an acid environment containing at least one strong oxidizer. In a preferred embodiment, strong oxidizer film 24, preferably $KMnO_4$, is spun onto monomer layer 22 and allowed to dry. Monomer layer 22 preferably is pyrrole.

Because oxyanions are stronger oxidizing agents in acidic than in neutral or basic solutions, it is preferred to cause oxidation and cross linking of monomer layer 22 by application of an acid environment to strong oxidizer film 24. According to the preferred example, the chip package is dipped into a nitric acid solution. According to the present invention, two reactions occur simultaneously when monomer layer 22 is pyrrole according to Equations (1) and (2).

$$6(C_4H_5N) + Al_2O_3 => 3—(C_4H_3N—C_4H_3N)—+2Al+3H_2O \quad (1)$$

$$2n(C_4H_5N) => n—(C_4H_3N—C_4H_3N)—+nH_2 \quad (2)$$

Figure 4:
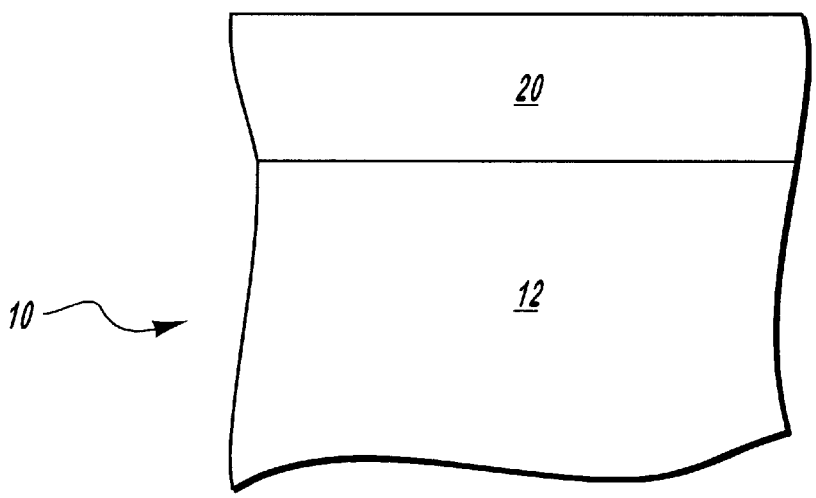
FIG. 4 is an elevational cross-section view of the bonding pad structure depicted in FIG. 3 after completion of processing according to the present invention, wherein the monomer layer has been converted to an electrically conductive polymer and wherein the native oxide film has been substantially eliminated through reduction of the native oxide film to zero valent metal.

If the strong oxidizer is $KMnO_4$ or the like, an increase of excess water in the permanganate solution as a byproduct is substantially harmless to the chemical environment. During cross linking of pyrrole to polypyrrole to form electrically-conductive polymer 20 as seen in FIG. 4, the simultaneous reduction of the alumina of native oxide film 14 to metallic aluminum occurs, the incidental cross linking of pyrrole to polypyrrole and the generation of gaseous hydrogen occurs, and the oxidation state of the manganese reduces in the direction towards its lowest oxidation number.

Alternatively, a cross-linking pyrrole monomer that does not directly bond with the native oxide of the aluminum bonding pad, will become cross linked in regions above free surface 16 of the aluminum bonding pad and will form a reaction byproduct of hydrogen gas according to Equation (2). Concurrently, permanganate reduces from a manganese oxidation number of +7 progressively to +5, +4, and finally to +2.

Finally, the chip package surface of PCB surface is cleaned according to the methods that are preferred for the particular application of the inventive method.

A series of specific examples are set forth below. The examples are prepared according to methods of the general example. Where a net electrode potential difference of starting materials is used as guidance for specific preferred embodiments, it is noted that the electrode potential difference between $MnO_4$ and pyrrole is about 2 V. Other oxyanions besides $MnO_4$ such as $Cr_2O_7$, $NO_3$, and $ClO_3$ are set forth in the examples. From the Table it can be seen that various electrode potential differences between single or mixed oxyanions and pyrrole are achieved.

TABLE

Electrode Potential Differences Between Selected Oxyanions and Pyrrole:

| Example | First Oxidizer | V | Fraction | Second Oxidizer | V | Fraction | Pyrrole, V | Electrode potential difference |
|---|---|---|---|---|---|---|---|---|
| 1 | $MnO_4$ | 1.51 | 1.0 | — | 1.23 | 0 | -0.5 | 2.01 |
| 2 | $MnO_4$ | 1.51 | 0.8 | $Cr_2O_7$ | 1.23 | 0.2 | -0.5 | 1.95 |
| 3 | $MnO_4$ | 1.51 | .5 | $Cr_2O_7$ | 1.23 | 0.5 | -0.5 | 1.87 |
| 4 | $MnO_4$ | 1.51 | 0.2 | $Cr_2O_7$ | 1.23 | 0.8 | -0.5 | 1.79 |
| 5 | $Cr_2O_7$ | 1.23 | 1.0 | — | .96 | 0 | -0.5 | 1.73 |
| 6 | $Cr_2O_7$ | 1.23 | 0.8 | $NO_3$ | .96 | 0.2 | -0.5 | 1.68 |
| 7 | $Cr_2O_7$ | 1.23 | 0.5 | $NO_3$ | .96 | 0.5 | -0.5 | 1.5 |
| 8 | $Cr_2O_7$ | 1.23 | 0.2 | $NO_3$ | .96 | 0.8 | -0.5 | 1.51 |
| 9 | $NO_3$ | .96 | 1.0 | — | | 0 | -0.5 | 1.46 |
| 10 | $NO_3$ | .96 | .8 | $ClO_3$ | 1.45 | 0.2 | -0.5 | 1.56 |
| 11 | $NO_3$ | .96 | .5 | $ClO_3$ | 1.45 | 0.5 | -0.5 | 1.7 |
| 12 | $NO_3$ | .96 | .2 | $ClO_3$ | 1.45 | 0.8 | -0.5 | 1.85 |
| 13 | $ClO_3$ | 1.45 | 1.0 | — | | 0 | -0.s | 1.95 |
| 14 | $ClO_3$ | 1.45 | .8 | $MnO_4$ | 1.51 | 0.2 | -0.5 | 1.96 |
| 15 | $ClO_3$ | 1.45 | .5 | $MnO_4$ | 1.5 | 0.5 | -0.5 | 1.98 |
| 16 | $ClO_3$ | 1.45 | .2 | $MnO_4$ | 1.51 | 0.8 | -0.5 | 2.0 |
| 17 | $MnO_4$ | 1.51 | .5 | $NO_3$ | .96 | 0.5 | -0.5 | 1.7 |
| 18 | $Cr_2O_7$ | 1.23 | .5 | $ClO_3$ | 1.45 | 0.5 | -0.5 | 1.84 |

In each example, at least one oxyanion is provided according to the general example. Pyrrole is also provided by forming monomer layer 22 upon a cleaned aluminum bonding pad 12 that has native oxide film 14 upon free surface 16.

Where a monomer is selected with an electrode potential that is less negative than that of pyrrole, the electrode potential difference may be about 1.2 V, about 1 V, or even about 0.8 V. In such a case it is preferred to increase the strong oxidizer concentration or the acidity of the strong oxidizer solution proportionally to the decreased electrode potential difference by using the electrode potential difference between $MnO_4$ and pyrrole as a baseline. Alternatively, it is preferred is such a case to increase the solution temperature or the acidity of the solution proportionally to the decreased electrode potential difference. Finally, a combination of increasing strong oxidizer concentration and increasing temperature may be used in connection with alternatively increasing solution acidity.

Where a monomer is selected with an electrode potential that is more negative than that of pyrrole, the electrode potential difference may be about 2.6 V, about 2.4 V, or even about 2.2 V. In such a case it is preferred to decrease the strong oxidizer concentration or the acidity of the strong oxidizer solution to proportionally compensate for the increased electrode potential difference by using the electrode potential difference between $MnO_4$ and pyrrole as a baseline. Alternatively, it is preferred in such a case to decrease the solution temperature or acidity of the solution proportionally to the decreased electrode potential difference. Finally, a combination of decreasing strong oxidizer concentration and decreasing temperature may be used in connection with alternatively decreasing solution acidity.

The same scheme of mixing strong oxidizers may be chosen to mix at least two preferred monomers in order to achieve a preferred embodiment of the present invention. For example, a two-monomer system of pyrrole and aniline is selected such that pyrrole is provided in initial quantities with aniline to form an electrically conductive polymer film comprising about 80% polypyrrole and about 20% polyaniline.

Of the preferred polymers set forth herein and equivalents, combinations of at least two monomers to form a composite polymer layer may be selected using the electrical conductivity of polypyrrole as a baseline. Thus, in a scheme similar to the mixing of strong oxidizers as set forth in the Table, at least two monomers may be selected to achieve composite electrical conductivities that vary from that of polypyrrole as a baseline by fractions from about 100% to 2,000%.

Examples of monomer mixtures include pyrrole with acetylene; p-phenylene with aniline; aniline with pyrrole; aniline with thiophene; acetylene with p-phenylene; acetylene with pyrrole; acetylene with thiophene; p-phenylene with pyrrole; p-phenylene with thiophene; pyrrole with p-phenylene; and pyrrole with thiophene. Of the above mixtures, mixtures of about 80% of a first monomer with about 20% of a second monomer, and 50% mixtures of each are contemplated. From these ratios, it can be appreciated that other ratios are useful such as 90:10, 70:30; and 60:40 ratios.

The present invention may be embodied in other specific forms without departing from its spirit or essential characteristics. The described embodiments are to be considered in all respects only as illustrated and not restrictive. The scope of the invention is, therefore, indicated by the appended claims and their combination in whole or in part rather than by the foregoing description. All changes that come within the meaning and range of equivalency of the claims are to be embraced within their scope.

What is claimed and desired to be secured by United States Letters Patent is:

1. A method of forming a bonding pad comprising:
   providing a metal bonding pad with a free surface;
   forming a metal oxide film on the free surface of the metal bonding pad;
   forming a first film upon said metal oxide film by:
      providing a monomer in a solvent carrier;
      depositing said monomer upon said metal oxide film, said monomer being selected from the group consisting of acetylene, p-phenylene, aniline, thiophene, and mixtures thereof; and
      removing at least some of said solvent carrier;
   forming a second film upon said first film; and
   causing said second film to at least partially oxidize said first film, whereby said first film achieves an increased electrical conductivity, and whereby said first film causes at least a portion of said metal oxide film to reduce to a metallic film.

2. A method of forming a bonding pad comprising:
   providing a metal bonding pad with a free surface;
   forming a metal oxide film on the free surface of the metal bonding pad;
   forming a first film upon said metal oxide film;
   forming a second film upon said first film by:
      providing an oxidizer in an oxidizer solvent is selected from the group consisting of nitrates, nitrides, chlorides, chlorates, perchlorates, oxides, peroxides, dichromates, manganates, permanganates, and oxyanions;
      depositing said oxidizer in an oxidizer solvent upon said first film; and
      removing at least some of said oxidizer solvent; and
   causing said second film to at least partially oxidize said first film, whereby said first film achieves an increased electrical conductivity, and whereby said first film causes at least a portion of said metal oxide film to reduce to a metallic film.

3. A method of forming a bonding pad comprising:
   providing a metal bonding pad with a free surface;
   forming a metal oxide film on the free surface of the metal bonding pad;
   forming a first film upon said metal oxide film;
   forming a second film upon said first film by:
      providing an oxidizer in an oxidizer solvent is selected from the group consisting of potassium perchlorate, potassium permanganate, potassium chlorate, potassium chromate, and potassium thiocyanate;
      depositing said oxidizer in an oxidizer solvent upon said first film; and
      removing at least some of said oxidizer solvent; and
   causing said second film to at least partially oxidize said first film, whereby said first film achieves an increased electrical conductivity, and whereby said first film causes at least a portion of said metal oxide film to reduce to a metallic film.

4. A method of forming a bonding pad comprising:
   providing a metal bonding pad with a free surface;
   forming a metal oxide film on the free surface of the metal bonding pad;
   forming a first film upon said metal oxide film;
   forming a second film upon said first film by:
      providing an oxidizer in an oxidizer solvent comprising potassium permanganate in a concentration range from about 0.1 M to about 2 M; and
      contacting said oxidizer in an oxidizer solvent upon said first film, said oxidizer solvent including an acidic medium; and causing said second film to at least partially oxidize said first film, whereby said first film achieves an increased electrical conductivity, and whereby said first film causes at least a portion of said metal oxide film to reduce to a metallic film.

5. A method of forming a bonding pad comprising:

providing a metal bonding pad with a free surface;

forming a metal oxide film on the free surface of the metal bonding pad;

forming a first film upon said metal oxide film;

forming a second film upon said first film; and causing said second film to at least partially oxidize said first film by contacting said first film with said second film, said second film containing an acidic medium selected from the group consisting of acids of nitric, hydrochloric, phosphoric, perchloric, hydrobromic, hydriodic, hydrofluoric, acetic, carboxylic, carbonic, sulfurous, and hydrocyanic, whereby said first film achieves an increased electrical conductivity, and whereby said first film causes at least a portion of said metal oxide film to reduce to a metallic film.

6. A method of forming a bonding pad according to claim 1, wherein:

said first film has a first electrode potential;

said second film has a second electrode potential; and said first electrode potential and said second electrode potential have a difference in a range from about 0.5 V to about 2.6 V.

7. A method of forming a bonding pad according to claim 2, wherein:

said first film has a first electrode potential;

said second film has a second electrode potential; and said first electrode potential and said second electrode potential have a difference in a range from about 0.5 V to about 2.6 V.

8. A method of forming a bonding pad according to claim 3, wherein:

said first film has a first electrode potential;

said second film has a second electrode potential; and said first electrode potential and said second electrode potential have a difference in a range from about 0.5 V to about 2.6 V.

9. A method of forming a bonding pad according to claim 4, wherein:

said first film has a first electrode potential;

said second film has a second electrode potential; and said first electrode potential and said second electrode potential have a difference in a range from about 0.5 V to about 2.6 V.

10. A method of forming a bonding pad according to claim 5, wherein:

said first film has a first electrode potential;

said second film has a second electrode potential; and said first electrode potential and said second electrode potential have a difference in a range from about 0.5 V to about 2.6 V.

11. A method of forming a bonding pad comprising:

providing a metal bonding pad with a free surface;

forming a metal oxide film on the free surface of the metal bonding pad;

providing a monomer in a solvent carrier, wherein said monomer is selected from the group consisting of acetylene, p-phenylene, pyrrole, aniline, thiophene, and mixtures thereof;

depositing said monomer having a first electrode potential upon said metal oxide film; and removing at least some of said solvent carrier;

providing an oxidizer in an oxidizer solvent, wherein said oxidizer in an oxidizer solvent is selected from the group consisting of nitrates, nitrides, chlorides, chlorates, perchlorates, oxides, peroxides, dichromates, manganates, permanganates, and oxyanions;

depositing said oxidizer in an oxidizer solvent having a second electrode potential that is more electropositive than said first electrode potential upon said monomer;

removing at least some of said oxidizer solvent;

contacting said monomer with said oxidizer in an oxidizer solvent, said oxidizer in an oxidizer solvent containing an acidic medium selected from the group consisting of acids of nitric, hydrochloric, sulfuric, phosphoric, perchloric, hydrobromic, hydriodic, hydrofluoric, acetic, carboxylic, carbonic, sulfurous, and hydrocyanic, whereby said monomer achieves an increased electrical conductivity, and whereby said monomer causes at least a portion of said metal oxide film to reduce to a metallic film.

12. A method of making a conductive bonding pad comprising:

providing an aluminum bonding pad on a substrate;

cleaning said aluminum bonding pad, whereby a native oxide film forms thereupon;

applying at least one monomer over the aluminum bonding pad, said at least one monomer comprising a reducing agent; and contacting said at least one monomer with an oxidizing material in an amount and strength sufficient to cross link said at least one monomer, to form at least one electrically conductive polymer, and to simultaneously cause said at least one electrically conductive polymer to reduce said native oxide film upon said aluminum bonding pad, wherein an electrode potential difference from about 0.5 V to about 2.5 V exists between said at least one monomer and said oxidizing material.

13. A method of making a conductive bonding pad according to claim 12, wherein the electrode potential difference between said oxidizing material and said at least one monomer is about 2 V.

14. A method of making a conductive bonding pad according to claim 12, wherein the electrode potential difference between said oxidizing material and said at least one monomer is about 1.5 V.

15. A method of making a conductive bonding pad according to claim 12, wherein the electrode potential difference between said oxidizing material and said at least one monomer is about 1.2 V.

16. A method of making a conductive bonding pad according to claim 12, wherein the electrode potential difference between said oxidizing material and said at least one monomer is about 1 V.

17. A method of forming a bonding pad according to claim 12, wherein said first electrode potential and said second electrode potential have a difference of about 0.9 V.

18. A method of making a conductive bonding pad according to claim 12, wherein said oxidizing material comprises about 80% potassium permanganate and the balance comprises at least one additional oxidizing material.

19. A method of making a conductive bonding pad according to claim 18, wherein the electrode potential difference between said oxidizing material and said at least one monomer is about 2 V.

20. A method of making a conductive bonding pad according to claim 18, wherein the electrode potential difference between said oxidizing material and said at least one monomer is about 1.5 V.

21. A method of making a conductive bonding pad according to claim 18, wherein the electrode potential difference between said oxidizing material and said at least one monomer is about 1.2 V.

22. A method of making a conductive bonding pad according to claim 18, wherein the electrode potential difference between said oxidizing material and said at least one monomer is about 1 V.

23. A method of making a conductive bonding pad according to claim 18, wherein the electrode potential difference between said oxidizing material and said at least one monomer is in a range from about 0.6 V to about 0.9 V.

24. A method of making a conductive bonding pad comprising:
providing an aluminum bonding pad on a substrate;
cleaning said aluminum bonding pad, whereby a native oxide film forms thereupon;
applying at least one monomer over the aluminum bonding pad, said at least one monomer comprising a reducing agent; and
contacting said at least one monomer with an oxidizing material in an amount and strength sufficient to cross link said at least one monomer, to form at least one electrically conductive polymer selected from the group consisting of polyacetylene, poly-p-phenylene, polypyrrole, polyaniline, and polythiophene, and to simultaneously cause said at least one electrically conductive polymer to reduce said native oxide film upon said aluminum bonding pad, wherein an electrode potential difference not greater than about 2.5 V exists between said at least one monomer and said oxidizing material, wherein said oxidizing material is selected from the group consisting of nitrates, nitrides, chlorides, chlorates, perchlorates, oxides, peroxides, dichromates, manganates, permanganates, and oxyanions.

25. A method of making a conductive bonding pad according to claim 24, wherein said at least one electrically conductive polymer comprises about 80% polypyrrole and about 20% polyaniline.

26. A method of making a conductive bonding pad according to claim 24, wherein the electrode potential difference between said oxidizing material and said at least one monomer is about 2 V.

27. A method of making a conductive bonding pad according to claim 24, wherein the electrode potential difference between said oxidizing material and said at least one monomer is about 1 V.

28. A method of making a conductive bonding pad according to claim 24, wherein the electrode potential difference between said oxidizing material and said at least one monomer is in a range from about 0.6 V to about 0.9 V.

29. A method of forming an electrical bonding interconnect between an aluminum bonding pad and an electrically conductive polymer comprising:
providing at least one aluminum bonding pad on a substrate;
cleaning said aluminum bonding pad, whereby a native oxide film forms thereupon;
applying pyrrole monomer in a carrier over said aluminum bonding pad;
removing at least some carrier from said pyrrole monomer;
forming a potassium permanganate film upon said pyrrole monomer; and
immersing said at least one aluminum bonding pad in an acid medium being in sufficient concentration with said potassium permanganate film to cross link at least a portion of said pyrrole monomer and to reduce at least a portion of said native oxide film to metallic aluminum.

30. A method of forming an electrical bonding interconnect between an aluminum bonding pad and an electrically conductive polymer according to claim 29, wherein applying pyrrole monomer in a carrier over said aluminum bonding pad includes applying at least one second monomer.

31. A method of forming an electrical bonding interconnect between an aluminum bonding pad and an electrically conductive polymer according to claim 30, wherein said at least one second monomer is selected from the group consisting of acetylene, p-phenylene, aniline, and thiophene.

32. A method of forming an electrical bonding interconnect between an aluminum bonding pad and an electrically conductive polymer according to claim 30, wherein said pyrrole monomer is provided at about 0.8 monomer mole fraction and said at least one second monomer is provided at about 0.2 monomer mole fraction.

33. A method of forming an electrical bonding interconnect between an aluminum bonding pad and an electrically conductive polymer according to claim 30, wherein said pyrrole monomer is provided at about 0.5 monomer mole fraction and said at least one second monomer is provided at about 0.5 monomer mole fraction.

34. A method of forming an electrical bonding interconnect between an aluminum bonding pad and an electrically conductive polymer comprising:
providing at least one aluminum bonding pad on a substrate;
cleaning said aluminum bonding pad, whereby a native oxide film forms thereupon;
applying pyrrole monomer at about 0.2 monomer mole fraction and at least one second monomer at about 0.8 monomer mole fraction in a carrier over said aluminum bonding pad;
removing at least some carrier from said pyrrole monomer;
forming a potassium permanganate film upon said pyrrole monomer; and
immersing said at least one aluminum bonding pad in an acid medium being in sufficient concentration with said potassium permanganate film to cross link at least a portion of said pyrrole monomer and to reduce at least a portion of said native oxide film to metallic aluminum, wherein an electrode potential difference from about 0.5 V to about 2.5 V exists between the composite of said pyrrole monomer and said at least one second monomer and between said potassium permanganate film.

35. A method of forming an electrical bonding interconnect between an aluminum bonding pad and an electrically conductive polymer according to claim 34, wherein said at least one second monomer is selected from the group consisting of acetylene, p-phenylene, aniline, and thiopene.

36. A method of forming an electrical bonding interconnect between an aluminum bonding pad and an electrically conductive polymer according to claim 34, wherein the electrode potential difference between said oxidizing material and said at least one monomer is about 2 V.

37. A method of forming an electrical bonding interconnect between an aluminum bonding pad and an electrically conductive polymer according to claim 34, wherein the electrode potential difference between said oxidizing material and said at least one monomer is about 1 V.

38. A method of forming an electrical bonding interconnect between an aluminum bonding pad and an electrically conductive polymer according to claim 34, wherein the electrode potential difference between said oxidizing material and said at least one monomer is about 0.9 V.

39. A method of forming an electrical bonding interconnect between an aluminum bonding pad and an electrically conductive polymer according to claim 34, wherein the electrode potential difference between said oxidizing material and said at least one monomer is in a range from about 0.6 V to about 0.9 V.

40. A method of forming a bonding pad comprising:
providing a metal bonding pas with a free surface;
forming a metal oxide film on the free surface of the metal bonding pad;
forming a first film upon said metal oxide film by:
  providing a monomer, which is a reducing agent, in a solvent carrier;
  depositing said monomer upon said metal oxide film; and
  removing at least some of said solvent carrier;
forming a second film upon said first film; and
causing said second film to at least partially oxidize said first film, whereby said first film achieves an increased electrical conductivity, and whereby said first film causes at least a portion of said metal oxide film to reduce to a metallic film.

41. The method as defined in claim 40, wherein:
the first film has a first electrode potential;
the second film has a second electrode potential; and
the second electrode potential is more electropositive than the first electrode potential.

42. The method as defined in claim 41, wherein the first electrode potential and said second electrode potential have a difference in a range from about 0.5 V to about 2.6 V.

43. The method as defined in claim 6, wherein the second electrode potential that is more electropositive than the first electrode potential.

44. A method of forming a bonding pad comprising:
providing a metal bonding pad with a free surface;
forming a metal oxide film on the free surface of the metal bonding pad;
forming a first film upon said metal oxide film, said first film having a first electrode potential;
forming a second film upon said first film, said second film having a second electrode potential that is more electropositive than said first electrode potential, by:
  providing an oxidizer in an oxidizer solvent, wherein said oxidizer in an oxidizer solvent is selected from the group consisting of nitrates, nitrides, chlorides, chlorates, perchlorates, oxides, peroxides, dichromates, manganates, permanganates, and oxyanions;
  depositing said oxidizer in an oxidizer solvent upon said first film; and
  removing at least some of said oxidizer solvent; and
causing said second film to at least partially oxidize said first film, whereby said first film achieves an increased electrical conductivity, and whereby said first film causes at least a portion of said metal oxide film to reduce to a metallic film.

45. A method of forming a bonding pad comprising:
providing a metal bonding pad with a free surface;
forming a metal oxide film on the free surface of the metal bonding pad;
forming a first film upon said metal oxide film, said first film having a first electrode potential;
forming a second film upon said first film, said second film having a second electrode potential that is more electropositive than said first electrode potential, by:
  providing an oxidizer in an oxidizer solvent, wherein said oxidizer in an oxidizer solvent is selected from the group consisting of potassium perchlorate, potassium permanganate, potassium chlorate, potassium chromate, and potassium thiocyanate;
  depositing said oxidizer in an oxidizer solvent upon said first film; and
  removing at least some of said oxidizer solvent; and
causing said second film to at least partially oxidize said first film, whereby said first film achieves an increased electrical conductivity, and whereby said first film causes at least a portion of said metal oxide film to reduce to a metallic film.

46. A method of forming a bonding pad comprising:
providing a metal bonding pad with a free surface;
forming a metal oxide film on the free surface of the metal bonding pad;
forming a first film upon said metal oxide film, said first film having a first electrode potential;
forming a second film upon said first film, said second film having a second electrode potential that is more electropositive than said first electrode potential, by:
  providing an oxidizer in an oxidizer solvent, wherein said oxidizer in an oxidizer solvent comprises potassium permanganate in a concentration range from about 0.1 M to about 2 M; and
  contacting said oxidizer in an oxidizer solvent upon said first film, said oxidizer solvent including an acidic medium; and
causing said second film to at least partially oxidize said first film, whereby said first film achieves an increased electrical conductivity, and whereby said first film causes at least a portion of said metal oxide film to reduce to a metallic film.

47. A method of forming a bonding pad comprising:
providing a metal bonding pad with a free surface;
forming a metal oxide film on the free surface of the metal bonding pad;
forming a first film upon said metal oxide film, said first film having a first electrode potential;
forming a second film upon said first film, said second film having a second electrode potential that is more electropositive than said first electrode potential; and
causing said second film to at least partially oxidize said first film by contacting said first film with said second film, where said second film contains an acidic medium selected from the group consisting of acids of hydrofluoric, acetic, carboxylic, carbonic, sulfurous, and hydrocyanic, whereby said first film achieves an increased electrical conductivity, and whereby said first film causes at least a portion of said metal oxide film to reduce to a metallic film.

48. A method of forming a bonding pad comprising:
forming a metal oxide film on a metal bonding pad;
forming a first film on the metal oxide film, the first film including a monomer in a solvent carrier, said monomer being selected from the group consisting of acetylene, p-phenylene, aniline, thiophene, and mixtures thereof;
forming a second film upon the first film; wherein:
  the second film has an electrode potential that is more electropositive than that of said first film;
  the second film oxidizes the first film;
  the first film is increased in electrical conductivity; and
  the metal oxide film is reduced to a metallic film.

* * * * *

UNITED STATES PATENT AND TRADEMARK OFFICE
CERTIFICATE OF CORRECTION

PATENT NO. : 6,113,709
DATED : September 5, 2000
INVENTOR(S) : Tongbi Jiang, Li Li It is certified that error appears in the above-identified patent and that said Letters Patent is hereby corrected as shown below:

Column 1,
Line 17, please change "which includes" to -- which include --

Column 3,
Line 28, please change "bonding pas" to -- bonding pad --

Column 5,
Line 16, please change "chemical rise" to -- chemical rinse --
Line 18, please change "Following the cleaning" to -- Followin cleaning --

Column 7,
Line 20, please change "groups of their" to -- groups or their --

Column 8,
Line 21, please change "surface of PCB" to -- surface or PCB --
Line 22, please change "according to the" to -- according to --

Column 9,
Line 7, please change "preferred is such" to -- preferred in such --

Column 10,
Lines 24 and 43, please change "solvent is selected" to -- solvent selected --

Column 15,
Line 10, please change "bonding pas" to -- bonding pad --
Line 34, please change "potential that is' to -- potential is --

Signed and Sealed this

Thirtieth Day of October, 2001

Attest:

NICHOLAS P. GODICI
Attesting Officer
Acting Director of the United States Patent and Trademark Office